United States Patent [19]
Geerdink et al.

[11] Patent Number: 5,157,347
[45] Date of Patent: Oct. 20, 1992

[54] SWITCHING BRIDGE AMPLIFIER

[75] Inventors: Lambertus H. Geerdink, Eindhoven; Hendrik Boezen, Nijmegen, both of Netherlands

[73] Assignee: U.S. Philips Corporation, New York, N.Y.

[21] Appl. No.: 822,493

[22] Filed: Jan. 17, 1992

[30] Foreign Application Priority Data

Jan. 24, 1991 [NL] Netherlands .......................... 9100115

[51] Int. Cl.$^5$ ............................................. H03F 3/45
[52] U.S. Cl. .................................... 330/260; 330/297; 330/104
[58] Field of Search ................. 330/260, 146, 104, 72, 330/69, 259, 297

[56] References Cited

U.S. PATENT DOCUMENTS

| | | | |
|---|---|---|---|
| 4,330,756 | 5/1982 | Moreau | 330/297 |
| 4,339,730 | 7/1982 | Yokoyama | 330/297 |
| 4,713,629 | 12/1987 | Segal | 330/297 |

Primary Examiner—Eugene R. LaRoche
Assistant Examiner—Tan Dinh
Attorney, Agent, or Firm—Edward W. Goodman

[57] ABSTRACT

Bridge amplifier circuit including a linear amplifier stage (3) which in single-ended configuration drives a load (13). Once the output voltage ($U_0$) at the output (7) of the amplifier stage (3) has reached the maximum or minimum output swing limit, the voltage on the load terminal (14) remote from the output (7) is either reduced or increased by a switch circuit (15) in response to control signals (36) originating from control means (37) in dependence on the input signal ($U_i$) and/or the output signal ($U_0$). The switch circuit (15) includes a bidirectional switch (16) arranged as two controllable diodes (90, $T_{11}$) connected in anti-parallel and having very little forward bias. Compensating voltage jumps at the output (7) of the amplifier stage (3), which require a high slew rate, are avoided in this manner.

1 Claim, 3 Drawing Sheets

SWITCHING BRIDGE AMPLIFIER

BACKGROUND OF THE INVENTION

1. Field of the Invention

The invention relates to a switching bridge amplifier comprising: an amplifier stage having an input for receiving an input signal to be amplified, and having an output for presenting an output voltage which varies in a positive and a negative sense relative to a reference voltage, a reference voltage terminal for connecting a reference voltage source for a reference voltage supply, first and second load terminals for connecting a load, the first load terminal being coupled to the output of the amplifier stage, a plurality of at least one positive switch voltage terminals, for connecting respective positive switch voltage sources to respective switch voltages which, in ascending steps deviate in a positive sense from the reference voltage, a plurality of at least one negative switch voltage terminals, for connecting respective negative switch voltage sources to respective switch voltages which in ascending steps deviate in a negative sense from the reference voltage, switch means comprising a reference switch, a number of positive switches corresponding to the plurality of positive switch voltage terminals, and a number of negative switches corresponding to the plurality of negative switch voltage terminals for connecting the second load terminal to the reference voltage terminal, one of the positive switch voltage terminals or one of the negative switch voltage terminals, and control means for generating control signals to activate the reference switch if the input voltage differs less than a threshold from the reference voltage, and to activate always one of the positive or negative switches respectively, if the input voltage differs more than the threshold from the reference voltage.

2. Description of the Related Art

A switching bridge amplifier of this type is known from European Patent application EP-A 0 147 306. In the conventional linear bridge amplifier, the second load terminal of the load is connected to a second amplifier stage identical with the first amplifier stage, which second amplifier stage is driven in opposite phase relative to the first amplifier stage. Such a configuration is known as a bridge amplifier and has for its object to generate with a given supply voltage a larger power in the load than is possible with a single amplifier stage. Without a driving input signal, the output voltages of the amplifier stages are equal to the reference voltage. With an increasing input signal the output voltages will increase in a mutually reverse sense. A positive voltage excursion relative to the reference voltage at the output of the first amplifier stage is accompanied by a negative excursion relative to the reference voltage at the output of the second amplifier stage, and vice versa. Thus, a peak-to-peak voltage may appear across the load, which voltage is twice as large as in a single amplifier stage in single-ended configuration, in which configuration one of the load terminals is connected to a fixed reference voltage. This may quadruple the power generated in the load.

Bridge amplifier circuits of this type are often used in audio signal amplifiers in which the load is a loudspeaker. More specifically, in battery-operated amplifiers having relatively low available supply voltages, such as in portable radio sets and car radios, the bridge circuit is used.

A disadvantage of the linear bridge amplifier circuit is that the mean power dissipation in the amplifier stages is relatively high. More specifically, in the event of relatively little power generated in the load, the heat dissipation in the amplifier stages is relatively high. The relatively small current through the load flows to the supply via the amplifier stages across which there is a relatively large voltage drop at that moment. This situation, which leads to a relatively large heat dissipation in the amplifier stages, statistically often occurs with audio signals.

From aforesaid European Patent application, it appears that a single amplifier stage in single-ended configuration will suffice, provided that for reaching the limit of th eoutput swing of this amplifier stage, the second load terminal normally connected to the reference voltage is connected to a switch voltage which is positive or negative relative to the reference voltage and the attendant voltage jump across the load is compensated by a suitable negative feedback of the voltage jump to the input of the amplifier stage. The operating point of the amplifier stage output then shifts as much as the voltage jump on the second load terminal. This provides room for a still larger output swing at the output of the amplifier stage. One half of this known bridge amplifier circuit is then not arranged as a linear amplifier, but as a switch which connects the load to a number of switch voltages which are positive and negative relative to the reference voltage. With this switched bridge amplifier configuration, a considerable dissipation reduction can be achieved compared with a bridge amplifier circuit comprising two linear amplifier stages which have the same supply voltage.

The known switching bridge amplifier comprises a reference switch which connects substantially without dissipation, the second load terminal to the reference voltage if the input signal, and thus also the output signal of the amplifier stage remains below a specific threshold relative to the reference voltage. The circuit then operates as a normal single-ended amplifier with the attendant dissipation which is lower relative to a standard linear bridge circuit. Furthermore, a plurality of at least one positive and negative switch voltage terminals are provided to which positive and negative switch voltages relative to the reference voltage are fed, and corresponding positive and negative switches which are activated if the input signal exceeds the threshold. Depending on the polarity of the output signal, a positive or negative switch is activated. Alternatively, it is possible to make a one-step change to the most positive or negative available switch voltage once the input signal has exceeded the threshold value. All this takes place under the control of control means which activate the correct switch in dependence on the value of the input and output signals of the amplifier stage.

The reference switch is to be capable of conducting the current through the load to the reference voltage terminal in two directions. Once the input signal has exceeded the threshold, the reference switch is to be rendered non-conductive and one of the positive or negative switches is to be rendered conductive.

The reference switch may be arranged in known manner comprising two transistors of opposite conductivity types connected in anti-parallel while a diode is included in the collector line to avoid reverse bias of the transistors. This configuration causes a slight voltage jump to occur across the reference switch each time the direction of the current through the reference switch is reversed. This voltage jump is fed to the input of the amplifier stage via the negative feedback means, so that this stage generates an equally large voltage jump at the output. For this purpose, the amplifier stage is to be capable of changing the voltage on its output very rapidly. Too small a bandwidth and/or slew rate causes signal distortion.

SUMMARY OF THE INVENTION

In order to overcome this problem, a switching bridge amplifier according to the invention is characterized, in that the reference switch comprises two controllable diodes connected in opposite directions of conduction between the second load terminal and the reference voltage terminal, each diode comprising:

an operational amplifier having an inverting and a non-inverting input, an output and a control input for controlling the gain of the operational amplifier;

and a transistor having a base coupled to the output of the operational amplifier and an emitter-collector path switched, on the one hand, across the inverting and non-inverting inputs of the operational amplifier and, on the other, across the second load terminal and the reference voltage terminal; and in that the control means comprise:

a control stage for supplying control signals to the control inputs of the operational amplifiers of the controllable diodes, which control signals are complementary and proportional to the output signal of the amplifier stage.

The reference switch according to the invention is arranged as two controllable diodes presenting a very low diode voltage drop. The operational amplifier keeps the voltage difference between the emitter and the collector of the transistor very low as long as current flows from the emitter to the collector of the transistor. The operational amplifier gain can be controlled by a control signal, so that the conduction of the controllable diode may be changed or even stopped entirely by means of a reduction of the base current supply to the transistor.

BRIEF DESCRIPTION OF THE DRAWINGS

The invention will now be further explained with reference to the appended drawings, in which.

In these drawing Figures like components have like reference numerals.

DESCRIPTION OF THE PREFERRED EMBODIMENT

Figure 1:
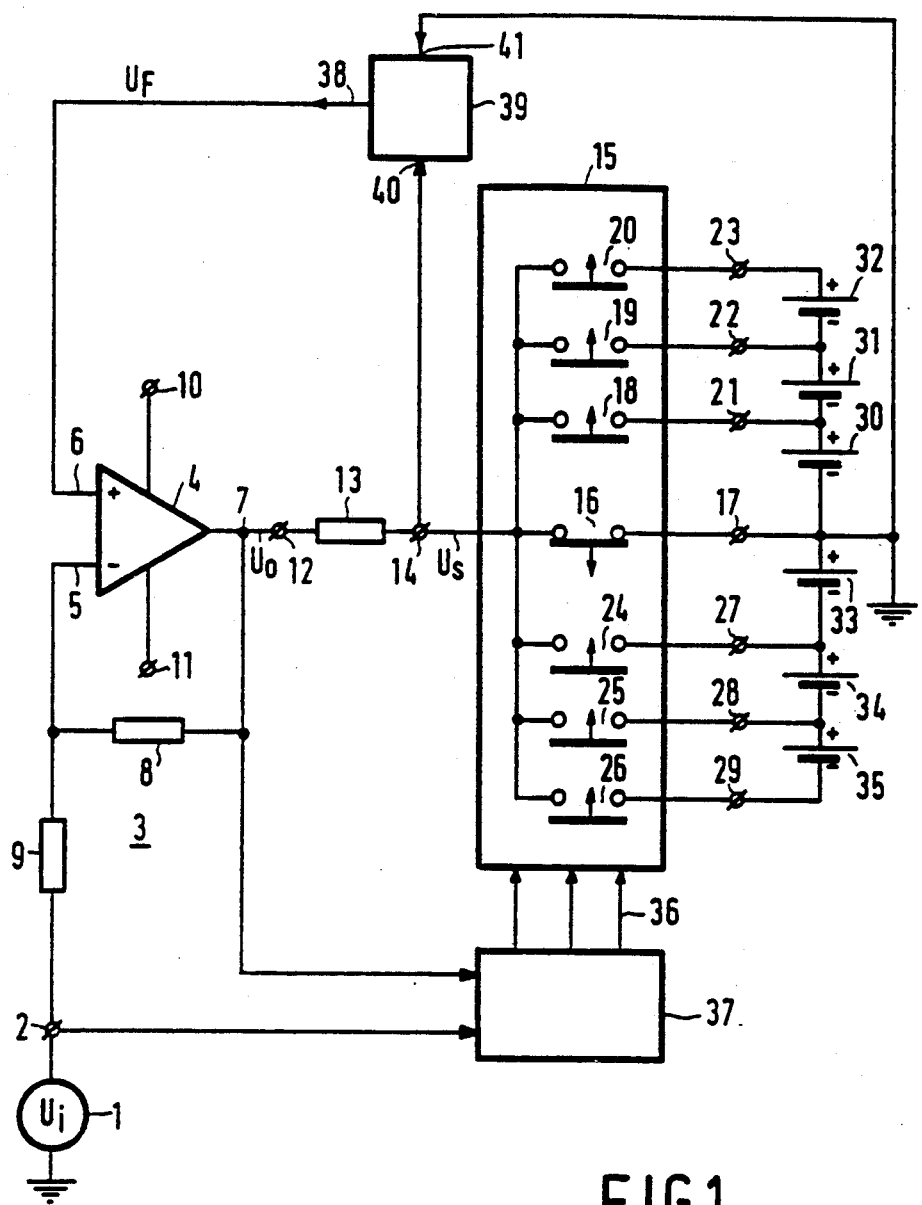
FIG. 1 shows a block diagram of a switching bridge amplifier.

FIG. 1 shows the block diagram of a switching bridge amplifier. An input signal $U_i$ of signal source 1 is connected to input terminal 2 of an amplifier stage 3 which comprises a differential amplifier 4 having an inverting input 5, non-inverting input 6 and an output 7 which likewise forms the amplifier stage output, and further includes a resistor 8 inserted between the output 7 and the inverting input 5, and a resistor 9 inserted between the input terminal 2 and the inverting input 5. The resistors 8 and 9 determine the gain factor A of the amplifier stage. The differential amplifier 4 comprises a positive supply terminal 10 and a negative supply terminal 11 for connecting supply voltages which may be positive or negative relative to a reference voltage $U_R$ connected to ground by way of example. The amplifier stage 3 produces an output signal which positively or negatively varies around the reference voltage $U_R$. The variation is restricted to an output swing determined by the supply voltages on the positive and negative supply terminals 10 and 11 and by the structure of the amplifier stage 3. The output 7 is connected to a first load terminal 12 of a whose second load terminal 14 is connected to switch circuit 15. The switch circuit 15 comprises a reference switch 16 connected between the second load terminal 14 and a reference voltage terminal 17, a plurality of positive switches 18, 19 and 20 connected between the second load terminal 14 and respective switch voltage terminals 21, 22 and 23, and a plurality of negative switches 24, 25 and 26 connected between the second load terminal 14 and the respective switch voltage terminals 27, 28 and 29. Positive switch voltage sources 30, 31 and 32 are connected to the respective positive switch voltage terminals 21, 22 and 23, so that an increasing voltage relative to the reference voltage terminal is generated across these terminals. This may be effected by connecting the sources 30, 31 and 32 in series, connecting the terminal having the lowest voltage to the reference voltage terminal 17 and the junctions and the other terminal to the switch voltage terminals 21, 22 and 23. Alternatively, the three positive switch voltage sources 30, 31 and 32 may be connected each with its negative pole to the reference voltage terminal 17 and each with its positive pole to the respective switch voltage terminals 21, 22 and 23. Negative switch voltage sources 33, 34 and 35 are similarly connected to the negative switch voltage terminals 27, 28 and 29, so that a diminishing voltage relative to the reference voltage terminal is present on these terminals. The numbers of positive and negative switches, switch voltage terminals and switch voltage sources in FIG. 1 are equally large and equal to three by way of example. A different number of at least one and a mutually unequal number for the two groups of switches, however, is also possible. Furthermore, the most positive and/or negative switch voltage need not be equal to the positive and/or negative supply voltages on the positive supply terminal 10 and the negative supply terminal 11 of the amplifier stage.

The reference switch 16, the positive switches 18, 19 and 20 and the negative switches 24, 25 and 26 are activated one by one, that is to say, closed, by circuit of control signals 36 coming from control means 37 in dependence on the input signal $U_i$ at input terminal 2 and an output signal $U_O$ at the output 7 of the amplifier stage 3.

The non-inverting input 6 of the differential amplifier 4 is connected to an output 38 of a negative feedback circuit 39, whose first input 40 is connected to the second load terminal 14 and whose second input 41 is connected to the reference voltage terminal 17. At output 38, the negative feedback circuit 39 generates a signal $U_F$ which is equal to the difference between the voltage $U_S$ on the second load terminal 14 and the reference voltage $U_R$ on the reference voltage terminal 17, which difference is reduced by the gain factor A: $U_F=(U_S-U_R)/A$.

The bridge circuit operates as follows. In the event of small signal amplitudes of the input signal $U_i$, the reference switch 16 is closed and the other switches of the switch circuit 15 are open. The amplifier stage 3 produces an amplified signal $U_O$ at the first load terminal 12 of the load 13. Once the input signal $U_i$ and the proportionally amplified signal $U_O$ exceed a certain threshold, the reference switch 16 is opened and the positive switch 18, in the event of a negative-going output signal $U_O$, or the negative switch 24, in the event of a positive-going output signal $U_O$, is closed. In the former case, the voltage $U_S$ on the second load terminal 14 makes a positive step in the order of the voltage difference between the positive switch voltage terminal 21 and the reference voltage terminal 17. In the latter case, the step is equal to the voltage difference between the negative voltage terminal 27 and the reference voltage terminal 17. For the voltage difference $U_O-U_S$ across the load to remain constant, the voltage difference $U_S-U_R$ between the second load terminal 14 and the reference voltage terminal 17 is reduced by the negative feedback circuit 39 by a factor as large as the gain factor A of the amplifier stage and is applied to the non-inverting input 6 of the differential amplifier. Consequently, the voltage $U_O$ changes as much on output terminal 7 as on the second load terminal 14 and the operating point at the output 7 is shifted relative to the reference voltage with either a positive or a negative step. In said former case with the negative-going output signal $U_O$, a new negative-going output swing occurs as a result of the positive-going shift of the operating point. In said latter case there is the reverse situation.

By creating a new output swing in one or more steps, three steps in this example, each time the input signal exceeds a specific threshold it becomes possible to produce as much power in the load with a single amplifier stage in single-ended configuration as with a conventional linear bridge circuit comprising two anti-phase driven amplifier stages. The dissipated power in the single-ended amplifier stage, however, is less than in the amplifier stages of a conventional bridge amplifier when there is an output swing to the threshold voltage, because in that case the load current flows through only a single amplifier. The dissipation in the reference switch is small and does not play any significant role. Once a change-over from the reference voltage to a positive or negative switch voltage has been established, the dissipation in the single-ended amplifier stage will initially increase relatively strongly with a further increasing input signal amplitude. However, the dissipation remains smaller than in a conventional bridge amplifier circuit. The gain is also determined by the threshold at which the reference switch 16 is rendered non-conductive and a positive or negative switch voltage is changed to. This threshold is preferably selected so that maximum use is made of the output swing of the amplifier stage 3. The limits of this output swing are determined by the positive and negative supply voltages on the supply terminals 10 and 11 of the amplifier stage 3 and by the internal structure of the amplifier stage.

The use of one positive and one negative switch is advantageous in that the voltage supply may be simpler, because the same supply voltages may be taken for the amplifier stage and the switches. Furthermore, it is possible to derive the reference voltage from the positive supply and the negative supply, so that the bridge amplifier circuit needs to have only a single supply source. With audio signals having virtually no d.c. component, the reference voltage may simply be produced by a voltage divider constituted by two resistors bridged each by a capacitor.

Figure 2:
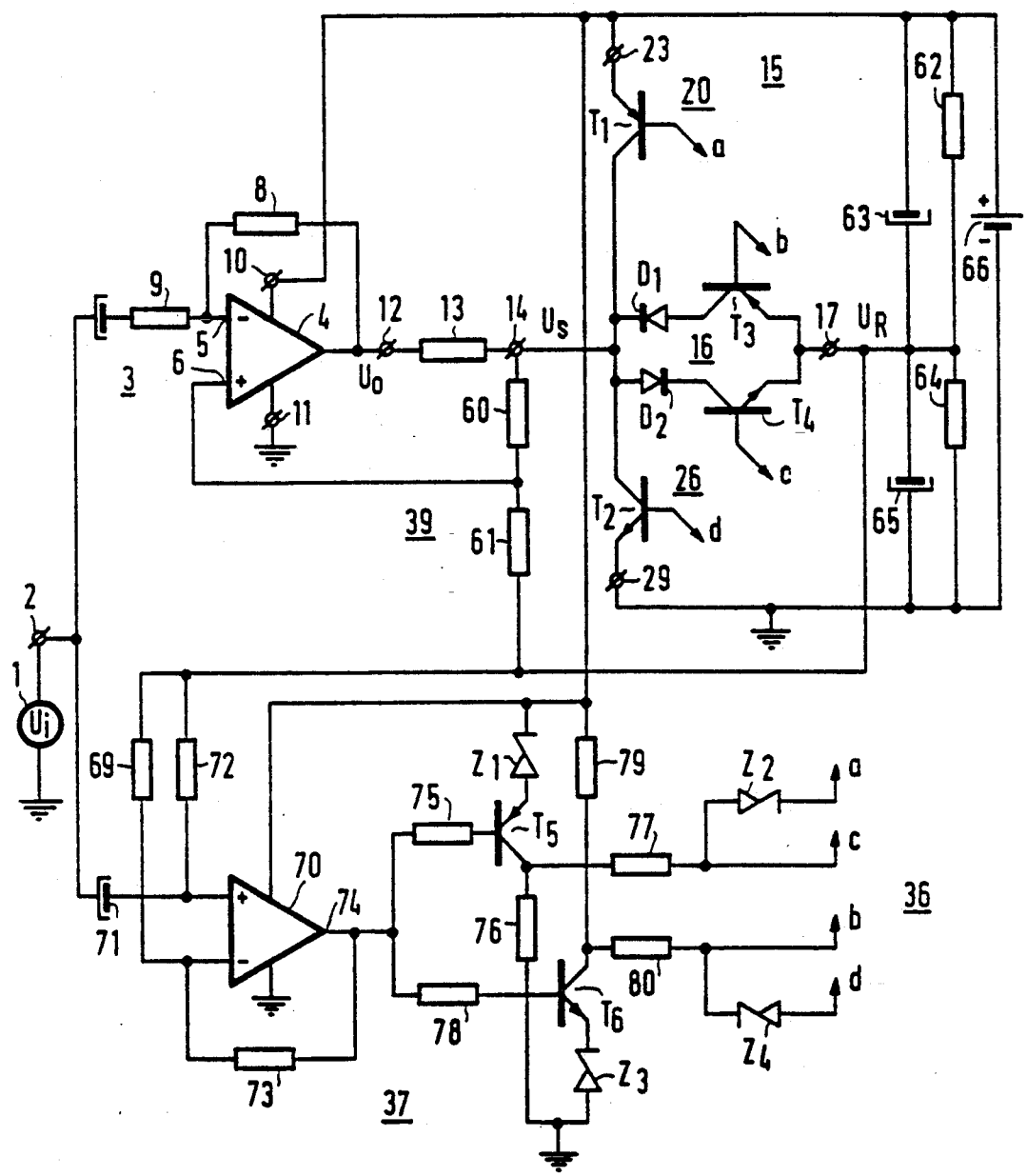
FIG. 2 shows a switching bridge amplifier in greater detail.

FIG. 2 shows the circuit diagram of a switching bridge amplifier. The negative feedback circuit 39 comprises a resistance divider having a resistor 60 with a value $R_{60}$ between the second load terminal 14 and the non-inverting input 6 of the amplifier stage 3 and a resistor 61 with a value $R_{61}$ between the non-inverting input 6 and the reference voltage terminal 17. The gain factor A of amplifier stage 3 is determined by the value $R_8$ of resistor 8 and the value $R_9$ of resistor 9 and is equal to $(R_8+R_9)/R_8$. The reduction of the voltage divider 60, 61 is equal to $R_{61}/(R_{60}+R_{61})$ and is set to be equal to the reverse of the gain factor A.

The switch circuit 15 comprises the positive switch 20, constituted by a PNP transistor $T_1$, whose emitter is connected to the positive switch voltage terminal 23 and whose collector is connected to the second load terminal 14, the negative switch 26, constituted by an NPN transistor $T_2$, whose emitter is connected to the negative switch voltage terminal 29 and whose collector is connected to the second load terminal 14, and the reference switch 16, arranged as a parallel combination of a PNP transistor $T_3$, whose emitter is connected to the reference voltage terminal 17 and whose collector is connected to the second load terminal 14 via a forward-biased diode $D_1$ whose anode is connected to the collector of transistor $T_3$, and an NPN transistor $T_4$, whose emitter is connected to the reference voltage terminal 17 and whose collector is connected to the second load terminal 14 via a forward-based diode $D_2$ whose cathode is connected to the collector of the transistor $T_4$. Currents flow through the reference switch in both directions. The diodes $D_1$ and $D_2$ prevent transistors $T_3$ and $T_4$ being reverse polarized.

The reference voltage terminal 17 is connected to a voltage divider comprising a parallel combination of a resistor 62 and a capacitor 63 between the positive switch voltage terminal 23 and the reference voltage terminal 17 and a parallel combination of a resistor 64 and a capacitor 65 between the negative switch voltage terminal 29 and the reference voltage terminal 17. By selecting equally large values for the resistors 62 and 64, the reference voltage is half the voltage difference across the positive switch voltage terminal 23 and the negative switch voltage terminal 29. The positive supply terminal 10 and the positive switch voltage terminal 23 are both connected to the positive terminal of a supply source 66, and the negative supply terminal 11 and the negative switch voltage terminal 29 are both connected to the negative terminal of the supply source 66 connected to ground. Supply source 66 may have the form of a car battery, a battery or another suitable supply source.

The control circuit 37 comprises a differential amplifier 70 having an output 74, an inverting and a non-inverting input. The non-inverting input is connected to the input 2 via a coupling capacitor 71 and to the reference voltage terminal 17 via a resistor 72. A negative feedback resistor 73 is connected between the output 74 and the inverting input which is connected to the reference voltage terminal 17 via a resistor 69. A signal proportional to the input signal but varying around the reference voltage is available on the output 74. Output 74 is connected, via a resistor 75, to the base of a PNP transistor $T_5$ whose emitter is connected, via a zener diode $Z_1$, to the positive supply terminal 10 and whose collector is connected, via a resistor 76, to the negative supply terminal 11. The collector of transistor $T_5$ is furthermore connected, via a resistor 77, to the base of the transistor $T_4$ in turn connected, via a zener diode $Z_2$, to the base of transistor $T_1$. Output 74 is connected, via a resistor 78, to the base of an NPN transistor $T_6$ whose emitter is connected, via a zener diode $Z_3$, to the negative supply terminal 11 and whose collector is connected, via a resistor 79, to the positive supply terminal 10. The collector of transistor $T_6$ is further connected, via a resistor 80, to the base of transistor $T_3$ which in turn is connected, via a zener diode $Z_4$, to the base of transistor $T_2$.

The zener voltages of the zener diodes $Z_1$ and $Z_3$ are proportioned so that the transistors $T_5$ and $T_6$ are conductive in the event of small signal-excursions around the reference voltage on output 74. Transistor $T_3$ receives base current through resistor 80, transistor $T_6$ and across zener diode $Z_3$ and is conductive then. Zener diode $Z_4$ prevents the transistor $T_2$ from becoming conductive. Transistor $T_4$ receives base current through resistor 77, transistor $T_5$ and across zener diode $Z_1$ and is also conductive. Zener diode $Z_2$ prevents transistor $T_1$ from becoming conductive.

With an increasing negative voltage-excursion on output 74, which corresponds to a positive excursion on output 7 due to the inverting gain of amplifier stage 3, the transistor $T_6$ will become less conductive and start to supply less base current to transistor $T_3$ in the event of a threshold determined by zener diode $Z_3$. With an even further negative excursion on output 74, the supply of base current to transistor $T_3$ will stop, so that this transistor is cut off completely. Zener diode $Z_4$ is proportioned so that it breaks down in the event of an even further negative excursion on output 74 and makes base current supply to transistor $T_2$ possible through the resistors 79 and 80. During this negative voltage excursion on output 74, transistor $T_5$ continues to be conductive so that also transistor $T_4$ continues to be conductive and transistor $T_1$ continues to be cut off. Because transistor $T_3$ has been cut off before transistor $T_2$ is rendered conductive, it is impossible for a current to flow from the reference voltage terminal 17 to the negative switch voltage terminal 29. The conduction of transistor $T_4$ stops by itself due to diode $D_2$. Thus a smooth change is ensured of the conduction through the reference switch 16 and the negative switch 26.

With an increasing positive voltage-excursion on output 74, a change will similarly be effected of the current conduction through reference switch 16 to the positive switch 26.

Figure 3:
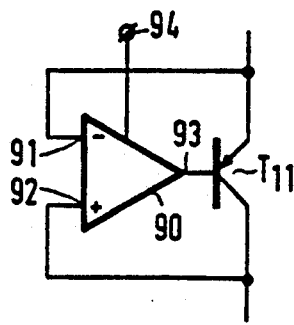
FIG. 3 shows a block diagram of a controllable diode to be used in a switching bridge amplifier according to the invention.

The reference switch 16 conducts the current in two directions, a slight voltage being present across the reference switch 16 and being sign inverted if the current through the reference switch 16 is reversed. This voltage is the sum of the diode voltage across diode $D_1$ or $D_3$ and the collector-emitter saturation voltage of transistor $T_3$ or $T_4$. Each time the signal to be amplified exceeds the reference voltage, the voltage $U_S$ on the second load terminal 14 performs a step which is to be compensated for by the amplifier stage 3 with an equally large step on output 7. The amplifier stage 3 is then to have a sufficient slew rate for producing the necessary voltage change at its output 7. A switch with a very low voltage drop is thus desired here. FIG. 3 shows a reference switch that can be regarded as a controllable diode having a very low forward voltage. The emitter and collector of a PNP transistor $T_{11}$ are connected to the inverting input 91 and a non-inverting input 92 respectively, of an operational amplifier 90 whose output 93 is connected to the base of the transistor $T_{11}$. The operational amplifier further has a control input 94 with which the gain of the operational amplifier 90 may be controlled.

If the emitter of transistor $T_{11}$ is positive relative to the collector, the voltage on output 93 will drop and supply base current to transistor $T_{11}$, so that the latter becomes conductive. The degree of conduction may be controlled with a control signal on control input 94, so that it is possible to switch the transistor $T_{11}$ off. The operational amplifier 90 constantly minimizes the voltage difference across the inverting input 91 and the non-inverting input 92 and thus also the voltage drop across the transistor $T_{11}$.

If the emitter of transistor $T_{11}$ is negative relative to the collector, the voltage on output 93 will rise and render transistor $T_{11}$ non-conductive. The whole thus behaves like a diode whose forward conduction is controllable.

Figure 4:
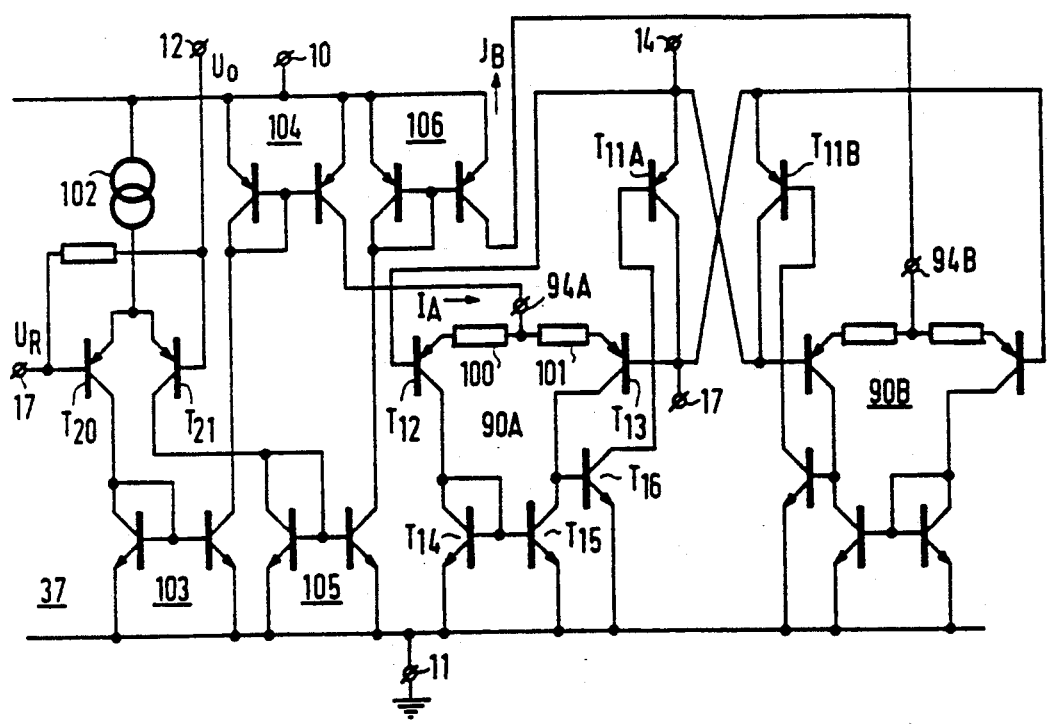
FIG. 4 shows a circuit diagram of a detail of a switching bridge amplifier according to the invention, comprising controllable diodes as shown in the block diagram of FIG. 3.

FIG. 4 shows the diagram of part of a bridge amplifier circuit whose reference switch 16 comprises two controllable diodes with dedicated control means arranged in an anti-parallel combination. Further components, such as the positive and negative switches 20 and 26 and associated control means, may be arranged in similar fashion to FIG. 2. Between the second load terminal 14 and the reference voltage terminal 17, the collector-emitter paths of PNP transistors $T_{11A}$ and $T_{11B}$ are connected cross-wise. These transistors are further connected to respective operational amplifiers 90A and 90B in the fashion shown in FIG. 2. Amplifier 90A comprises a differential amplifier with PNP transistors $T_{12}$ and $T_{13}$ whose emitters, which comprise the respective resistors 100 and 101, are connected to the control input 94A of the amplifier 90A. The base of transistor $T_{12}$ is connected to the emitter of transistor $T_{11A}$ and forms the inverting input. The base of transistor $T_{13}$ is connected to the collector of $T_{11A}$ and forms the non-inverting input. The collector of transistor $T_{12}$ is connected to the input of a mirror current circuit, formed by the collector of a diode-arranged NPN transistor $T_{14}$ whose emitter is connected to the negative supply terminal 11. The output of the current mirror circuit, formed by the collector of an NPN transistor $T_{15}$ whose base-emitter junction is arranged in parallel with that of the transistor $T_{14}$, is connected to the collector of transistor $T_{13}$ and to the base of an NPN transistor $T_{16}$. The emitter of transistor $T_{16}$ is connected to the negative supply terminal 11 and the collector of transistor $T_{16}$, being the output of amplifier 90A, is connected to the base of transistor $T_{11A}$. Operational amplifier 90B is identical with the amplifier 90A.

If the voltage on the second load terminal 14 is positive relative to the voltage on the reference voltage terminal 17, a control current $I_A$ presented to a control input 94A will flow to the base of transistor $T_{16}$ via transistor $T_{13}$. This current is amplified in transistor $T_{16}$, so that transistor $T_{11A}$ is rendered conductive. By regulating the control current $I_A$, the conduction of transistor $T_{11A}$ may be controlled and even be brought back to zero if the control current is made zero. If the voltage on terminal 14 is negative relative to the voltage on terminal 17, the control current $I_A$ will be taken from the base of transistor $T_{16}$ via transistor $T_{12}$ and the current mirror circuit $T_{14}$, $T_{15}$, so that transistor $T_{16}$ and hence transistor $T_{11A}$ become currentless.

The control current $I_A$ for operational amplifier 90A and the complementary control current $I_B$ are supplied by associated control means 37 in which the output voltage $U_0$ of the amplifier stage 3 on the first load terminal is compared with the reference voltage $U_R$ on terminal 17 with the aid of a differential amplifier constituted by PNP transistors $T_{20}$ and $T_{21}$, whose emitters are connected to the positive supply terminal 10 via an adjustable current source 102, and whose collectors are coupled to the control inputs 94A and 94B respectively, via the respective current mirror circuits 103, 104 and 105, 106. The base of transistor $T_{20}$ is connected to the reference voltage terminal 17 and the base of transistor $T_{21}$ to the first load terminal 12. The collector currents of the transistors $T_{20}$ and $T_{21}$ are complementary and their sum if determined by the adjustable current source 102. Depending on the sign of the voltage difference between $U_0$ and $U_R$, either transistor $T_{11A}$ or $T_{11B}$ will be cut off when the amplitude of this voltage difference increases, so that, similar to the circuit shown in FIG. 2, a smooth current transfer is possible when the positive switch 20 or negative switch 26 is activated.

The invention is not restricted to the embodiments shown. PNP and NPN transistors may be exchanged provided that the polarity of the supply voltages, control signals, diodes and zener diodes is taken into consideration.

We claim:

1. Switching bridge amplifier comprising:

an amplifier stage having an input for receiving an input signal to be amplified, and having an output for presenting an output voltage which varies in a positive and a negative sense relative to a reference voltage;

a reference voltage terminal for connecting a reference voltage source for a reference voltage supply;

first and second load terminals for connecting a load, the first load terminal being coupled to the output of the amplifier stage;

a plurality of at least one positive switch voltage terminals, for connecting respective positive switch voltage sources to respective switch voltages which, in ascending steps deviate in a positive sense from the reference voltage;

a plurality of at least one negative switch voltage terminals, for connecting respective negative switch voltage sources to respective switch voltages which, in ascending steps deviate in a negative sense from the reference voltage;

switch means comprising a reference switch, a number of positive switches corresponding to the plurality of positive switch voltage terminals, and a number of negative switches corresponding to the plurality of negative switch voltage terminals for connecting the second load terminal to the reference voltage terminal, one of the positive switch voltage terminals or one of the negative switch voltage terminals; and control means for generating control signals to activate the reference switch if the input voltage differs less than a threshold from the reference voltage, and to activate always one of the positive or negative switches respectively, if the input voltage differs more than the threshold from the reference voltage, characterized in that the reference switch comprises two controllable diodes connected in opposite directions of conduction between the second load terminal and the reference voltage terminal, each controllable diode comprising:

an operational amplifier having an inverting and a non-inverting input, an output and a control input for controlling the gain of the operational amplifier;

and a transistor having a base coupled to the output of the operational amplifier and an emitter-collector path switched, on the one hand, across the inverting and non-inverting inputs of the operational amplifier and, on the other, across the second load terminal and the reference voltage terminal; and in that the control means comprises:

a control stage for supplying control signals to the control inputs of the operational amplifiers of the controllable diodes, which control signals are complementary and proportional to the output signal of the amplifier stage.

* * * * *